United States Patent [19]
Watanabe et al.

[11] Patent Number: 6,153,895
[45] Date of Patent: Nov. 28, 2000

[54] P-TYPE SEMICONDUCTOR, METHOD FOR MANUFACTURING THE P-TYPE SEMICONDUCTOR, SEMICONDUCTOR DEVICE, PHOTOVOLTAIC ELEMENT, AND METHOD FOR MANUFACTURING SEMICONDUCTOR DEVICE

[75] Inventors: Takayuki Watanabe, Fuji; Tetsuya Yamamoto, Kochi; Hiroshi Yoshida, Kawanishi, all of Japan

[73] Assignee: Asahi Kasei Kogyo Kabushiki Kaisha, Japan

[21] Appl. No.: 09/341,314

[22] PCT Filed: Aug. 14, 1997

[86] PCT No.: PCT/JP97/02829

§ 371 Date: Jul. 8, 1999

§ 102(e) Date: Jul. 8, 1999

[87] PCT Pub. No.: WO98/33219

PCT Pub. Date: Jul. 30, 1998

[30] Foreign Application Priority Data

Jan. 24, 1997 [JP] Japan ................................. 9-011763
May 12, 1997 [JP] Japan ................................. 9-121136

[51] Int. Cl.[7] ............... H01L 31/072; H01L 31/109; H01L 31/0328; H01L 31/0336
[52] U.S. Cl. ................. 257/101; 257/183; 257/184; 257/609
[58] Field of Search ................... 257/184, 183, 257/101, 609; 438/94, 93; 136/236.1, 241

[56] References Cited

U.S. PATENT DOCUMENTS 3,932,291 1/1976 Donohue ............................. 252/62.3
5,389,572 2/1995 Negami et al. ...................... 437/141
5,474,622 12/1995 Negami et al. ...................... 136/265
5,626,688 5/1997 Probst et al. ....................... 136/265

FOREIGN PATENT DOCUMENTS

| 0 743 686 | 11/1996 | European Pat. Off. . |
|---|---|---|
| 404336472 | 11/1992 | Japan . |
| 6-97481 | 4/1994 | Japan . |
| 6-244442 | 9/1994 | Japan . |
| 406283738 | 10/1994 | Japan . |
| 8-102546 | 4/1996 | Japan . |
| 8-222750 | 8/1996 | Japan . |
| 9-55378 | 2/1997 | Japan . |
| 9-213978 | 8/1997 | Japan . |

*Primary Examiner*—William Mintel
*Attorney, Agent, or Firm*—Finnegan, Henderson, Farabow, Garrett & Dunner, L.L.P.

[57] ABSTRACT

A p-type semiconductor composed basically of an Ib-IIIb-VIb$_2$ group compound semiconductor (especially CuInS$_2$) which is improved in carrier concentration and has advantages in manufacture and performance. In order to obtain the p-type semiconductor mentioned above, p-type CuInS$_2$ is formed by adding both P (p-type impurity) and Sn (n-type impurity) to CuInS$_2$. The carrier concentration of the p-type semiconductor is $5 \times 10^{17}$ cm$^{-3}$ which is larger than the value ($5 \times 10^{16}$ cm$^{-3}$) obtained when P and In are added or another value ($3 \times 10^{15}$ cm$^{-3}$) obtained when only P is added. A thin film solar cell characterized by a glass substrate (2), an Mo electrode (1), a p-type semiconductor layer (3), an n-type semiconductor layer composed of a CdS layer (4), and an ITO electrode (5) is manufactured by using the CuInS$_2$ layer containing P and Sn as the p-type semiconductor (3). It is confirmed that the conversion efficiency of the solar battery is as high as 12%.

36 Claims, 2 Drawing Sheets

P-TYPE SEMICONDUCTOR, METHOD FOR MANUFACTURING THE P-TYPE SEMICONDUCTOR, SEMICONDUCTOR DEVICE, PHOTOVOLTAIC ELEMENT, AND METHOD FOR MANUFACTURING SEMICONDUCTOR DEVICE

TECHNICAL FIELD

The present invention concerns a p-type semiconductor containing impurities in an Ib-IIIb-VIb$_2$ group compound semiconductor and, more particularly, it relates to a high performance p-type semiconductor which is suitable to use as a photovoltaic device such as a solar cell or a light emitting element.

BACKGROUND ART

Compound semiconductors have been applied to semiconductor devices such as solar cells and light emitting elements. When such devices are manufactured, a p-type semiconductor and an n-type semiconductor are necessary and compound semiconductors are doped with elements other than the constituent elements, in order to obtain semiconductors of respective conduction types.

It has been known, for example, in a case of Ib-IIIb-(VIb)$_2$ group compound semiconductors such as CuInS$_2$ to add impurity of a Vb group element for obtaining a p-type and a VIIb group element for obtaining an n-type.

Further, for IIIb-vb group compound semiconductors such as GaN, a IIa group element is used for obtaining the p-type and a IVb group element is used for obtaining the n-type, respectively, as impurities and, for IIb-VIb group compound semiconductors such as ZnSe, a Vb group element is used for obtaining the p-type and a VIIb group element is used for obtaining the n-type, respectively, as impurities.

Such compound semiconductors show conductivity (p-type or n-type) by substitution of an added impurity for a portion of constituent elements of the compound semiconductor. When a p-type semiconductor is formed, generally, an element with the number of electrons in the outermost shell smaller by one compared with that of a constituent element to be substituted is chosen as the impurity, whereas an element with the number of electrons in the outermost shell larger by one is chosen in a case of an n-type semiconductor.

However, when a p-type impurity is doped to a compound semiconductor for obtaining the p-type conductivity, particularly, a compound semiconductor having a strong ionic bond character, a negative element (electron receptive element) constituting the compound semiconductor is eliminated and the acceptor for the valence electron of the positive element (electron donating element) is lost to generate a donor defect. The effect of the doped p-type impurity is offset by the donor defect, so that the p-type carrier concentration is not increased as expected. That is, there is a problem, in that it is difficult to obtain a p-type semiconductor at a high carrier concentration corresponding to a high doping amount.

Further, if the amount of the added p-type impurity is increased greatly in order to increase the carrier concentration, this causes a lowering of the crystallinity due to crystal distortions in a compound semiconductor as a matrix or segregation of a doping element to a crystal grain boundary, and this results in a problem of failing to obtain a necessary function.

With the problems described above, semiconductor devices utilizing p-type semiconductors having compound semiconductors with strong ionic bonds as the matrix, for example, those having satisfactory performance as solar cells based on CuInS$_2$, or the like and blue light emitting elements based on GaN, ZnSe or CuAlSe$_2$, have not yet been obtained.

Among them, for a p-type semiconductor having GaN as the matrix, it has been reported by Brandt, et al that a p-type semiconductor having a high carrier concentration can be formed by adding Be as an acceptor, together with 0 as a donor, to GaN (refer to Appl. Phys. Lett., Vol. 69, No. 18 (1996) 2707). In this case, since the difference of the electric negativity between impurities Be and 0 is large and, they tend to be present in the vicinity of GaN crystals, the carrier concentration is increased.

Further, Yamamoto, et al. propose to supply electrons to Cu-S bonds by the doping of a p-type impurity by partially substituting In atoms for Cu atoms as the constituent elements of CuInS$_2$, thereby increasing the p-type carrier concentration of CuInS$_2$, (See "The 1996 MRS Spring meeting Symposium in San Francisco").

That is, when Cu atoms of a Ib group element are partially substituted with In atoms of a IIIb group element, to provide a state: Cu<In, the number of electrons in CuInS$_2$ is increased compared with that in the state of Cu:In=1:1, and surplus electrons are supplied to the Cu—S bonds. But this proposed method is different from the method of doping CuInS$_2$ with a p-type impurity and an n-type impurity, which are not constituent elements of CuInS$_2$.

However, when Cu atoms as the constituent elements of CuInS$_2$ are partially substituted with In atoms, InCu (In substituted for the site of Cu) is formed as a donor defect and, at the same time, a Cu vacancy is formed as an acceptor defect for keeping electric charges neutral in the vicinity thereof. Accordingly, since it is difficult to exactly control the amount of electrons supplied to the Cu—S bonds by the substitution amount of In for Cu, this method involves a difficulty in the manufacture of the devices.

Further, since In atoms become excessive in this method, a CuIn$_5$S$_8$, phase having a spinel structure, which is different from CuInS$_2$ having a chalcopyrite structure, is also present with the CuInS$_2$. If phases of different crystal structures are present together, many defects tend to occur, particularly, at the crystal grain boundaries of the CuInS$_2$ layer. In addition, the CuIn$_5$S$_8$, phase has high resistivity. As a result, it also gives rise to a problem of difficulty in forming a p-type CuInS$_2$, at a high carrier concentration.

The present invention has been accomplished taking notice on the foregoing problems in the prior art and it is an object thereof to form a p-type semiconductor at a high carrier concentration in an Ib-IIIb-VIb$_2$ group compound semiconductor such as CuInS$_2$, which has higher performance and gives more advantage in the manufacture thereof compared with the prior art method, and to provide a semiconductor device of higher performance by using such p-type semiconductor.

DISCLOSURE OF THE INVENTION

For solving the foregoing problems, the present invention provides a p-type semiconductor containing a p-type impurity comprising a IIa group element and/or a Vb group element and an n-type impurity comprising a IVb group element and/or a VIIb group element in a Ib-IIIb-VIb$_2$ group compound semiconductor.

Due to the presence of the n-type impurity, the p-type semiconductor is a p-type semiconductor at a higher carrier concentration compared with the case where there is contained an identical amount of the p-type impurity and none of the n-type impurity.

In the present invention, the p-type impurity means an acceptor impurity while the n-type impurity means a donor impurity.

The present invention also provides a method of manufacturing p-type semiconductor which comprises adding a p-type impurity comprising a IIa group element and/or a Vb group element and an n-type impurity comprising a IVb group element and/or a VIIb element to a Ib-IIIb-VIb2 group compound semiconductor, such that the content of the p-type impurity is higher than that of the n-type impurity.

According to this method, a p-type semiconductor containing both of the p-type impurity and the n-type impurity can be obtained. In the p-type semiconductor, the carrier concentration can be increased by addition of the n-type impurity together with the p-type impurity compared with the case of adding only the p-type impurity in an identical addition amount.

A combination of the p-type impurity and the n-type impurity incorporated into the Ib-IIIb-VIb$_2$ group compound semiconductor includes a combination in which the p-type impurity is a IIa group element and the n-type impurity is a IVb group element. In this case, it is preferable that the p-type impurity is Be and/or Mg and the n-type impurity is at least one of Ge, Sn and Pb.

Another combination includes a combination in which the p-type impurity is a IIa group element and the n-type impurity is a VIIb group element. In this case, it is preferable that the p-type impurity is Be and/or Mg and the n-type impurity is at least one of Cl, Br and I. Among them, it is particularly preferred that the p-type impurity is Be and the n-type impurity is Cl.

A further combination includes a combination in which the p-type impurity is a Vb group element and the n-type element is a IVb group element. In this case, it is preferable that the p-type impurity is at least one of P, As and Sb and the n-type impurity is at least one of Ge, Sn and Pb. Among them, it is particularly preferred that the p-type impurity is P and the n-type impurity is Sn.

A further combination includes a combination in which the p-type impurity is a Vb group element and the n-type impurity is a VIIb group element. In this case, it is preferable that the p-type impurity is at least one of P, As and Sb and the n-type impurity is at least one of Cl, Br and I.

Further, among the combinations described above, a combination in which the p-type impurity is a IIa group element and the n-type impurity is a VIIb group element, and a combination in which the p-type impurity is a Vb group element and the n-type impurity is an IVb group element are preferred.

The p-type carrier concentration is increased in the p-type semiconductor obtained by adding both of the p-type impurity and the n-type impurity to the Ib-IIIb-VIb$_2$ group compound semiconductor due to the following reasons.

While an elementary semiconductor such as Si or Ge includes covalent bonds to nearly 100%, an Ib-IIIb-Vib$_2$ group compound semiconductor includes covalent bonds having ionic bonding property. Among them, CuInS$_2$ has stronger ionic bond character compared with CuInSe$_2$ or the like. The ionic bond character tend to be increased as the difference of the electric negativity is larger between the positive element and the negative element.

Then, in a compound semiconductor having stronger ionic bond character, a negative element (electron receptive element) that constitutes a compound semiconductor tends to be eliminated more upon adding a p-type impurity, but elimination of such a negative element can be prevented by also adding the n-type impurity as described above. This increases the p-type carrier concentration compared with the case of not also doping the n-type impurity.

Further, for obtaining a p-type semiconductor, it is necessary to make the amount of the p-type impurity added more than that of the n-type impurity and, while an optimum ratio between both of them varies depending, for example, on a desired p-type carrier concentration and the kind of the impurities added, the content of the p-type impurity is preferably 1.3 to 3.0 times, more preferably, 1.8 to 2.2 times, the content of the n-type impurity.

The value of a p-type carrier concentration in a p-type semiconductor containing both of a p-type impurity and an n-type impurity in an Ib-IIIb-VIb2 group compound semiconductor corresponds to the difference between the content of the p-type impurity and the content of the n-type impurity. If the difference is small (that is, the ratio of the content of the p-type impurity to the content of the n-impurity, which should be greater than 1, is approximately 1), it is necessary to increase the contents for both of the impurities in order to obtain a high p-type carrier concentration, but this lowers the crystallinity due to crystal distortion.

Accordingly, in order to enhance the effect of the present invention, it is necessary to increase the content of the p-type impurity much greater than the content of the n-type impurity and, if the content of the p-type impurity is 1.3 or more times the content of the n-type impurity, a satisfactory p-type conduction is obtained easily within a range not deteriorating the crystallinity. On the other hand if the content of the p-type impurity exceeds 3.0 times the content of the n-type impurity, the effect of suppressing the elimination of the negative element in the compound semiconductor by the addition of the n-type impurity is reduced, making it difficult to obtain a high p-type carrier concentration.

The effect of the present invention is high, particularly when it is applied to CuInS$_2$ of Ib-IIIb-VIb$_2$ type compound semiconductors, and a p-type semiconductor at a carrier concentration of $1 \times 10^{17}$ (cm$^{-3}$) or higher can be obtained by incorporating both of a p-type impurity and an n-type impurity in CuInS$_2$ composed of a single chalcopyrite phase.

CuInS$_2$ composed of the single chalcopyrite phase is CuInS$_2$ having only the CuInS$_2$ phase of a chalcopyrite structure as the crystal structure in which the Cu to In ratio (Cu/In) ranges about from 0.92 to 1.00. If the Cu content is higher than the range mentioned above, the CuInS$_2$ contains a Cu$_x$S phase, while if the In content is higher it contains a CuIn$_5$S$_8$, phase. Then, if the CuIn$_5$S$_8$ phase is contained, since the CuIn$_5$S$_8$ phase is highly resistive, the carrier concentration is not increased as described above.

But in a case of containing the Cu$_x$S phase, since the Cu$_x$S phase has low resistivity, the CuInS$_2$ phase, which has the Cu$_x$S phase also present together with the CuInS$_2$ phase, can easily give a p-type carrier concentration of $1 \times 10^{17}$ (cm$^{-3}$) or higher even not adopting a method of adding both of the p-type and n-type impurities as in the present invention. However, in a case of CuInS$_2$ composed of the single chalcopyrite phase, those having the p-type concentration of $1 \times 10^{17}$ (cm$^{-3}$) or more have not yet been found, and they have been realized by the method of the present invention.

The performance of a semiconductor device using a p-type semiconductor at a high carrier concentration having CuInS$_2$ as a matrix, in which a Cu$_x$S phase is present together in the CuInS$_2$ phase, is extremely low and, if it is a solar cell, for example, a conversion efficiency thereof is nearly zero.

Referring to $CuInS_2$ as an example, explanations will be made in details as to the difference of the effect between the method according to the present invention and the prior art method.

$CuInS_2$ has In—S bonds and Cu—S bonds. In the In-S bond, since the total of three electrons in the outermost shell of In and six electrons in the outermost shell of S is 9, it is surplus by one compared with 8 for stable bonds. In the Cu-S bond, since the total of one electron in the outermost shell of Cu and six electrons in the outermost shell of S is 7, it is insufficient by one compared with 8 for stable bonds. Then, one surplus electron in the In—S bond is supplied for compensation of insufficiency of electrons in the Cu—S bond to stabilize the system (matrix) as a whole.

However, if a Vb group element such as P (having the number of electrons in the outermost shell of 5) as the p-type impurity is added and substituted for S, the In—P bond is stabilized since the number of electrons in the outermost shell is 8, but this gives no surplus electrons to be supplied to the Cu—S bond.

Therefore, the Cu—S bond becomes unstable compared with the case of not adding the p-type impurity. In such the state, Cu is liable to be eliminated since energy is eliminated. When Cu is eliminated, this induces elimination of S adjacent thereto or elimination of the added p-type impurity (P). Such elimination of S or P arises from an increase of a coulombic repulsion between electrically negative S and P which become adjacent each other by elimination of Cu.

A Cu eliminated portion (Cu vacancy) forms an acceptor defect and an S or P vacated portion (S vacancy) forms a donor effect. Then, since Cu is monovalent and S is bivalent, when Cu and S are eliminated each by an identical number, donor defects are increased as a whole tending to increase the donor property. Since the donor defect offsets the doping effect of the p-type impurity as the acceptor (the added p-type impurity is used for compensation of donor defect), a p-type carrier concentration corresponding to the doped amount of the p-type impurity can not be obtained On the contrary, if an n-type impurity, for example, an IVb group element such as Sn (having 4 electrons in the outermost shell) is added together upon addition of the p-type impurity as in the method of the present invention and, since this substitutes for In (having 3 electrons in the outermost shell) to give a surplus of one electron and the surplus electron is supplied to the Cu—S bond, Cu elimination as described above does not occur. Thus, since the donor defect as described above is not formed, a p-type carrier concentration corresponding to the doped amount of the p-type impurity can be obtained.

For stabilizing the Cu—S bond by effectively supplying electrons to the Cu—S bond, which had become unstable by the addition of the p-type impurity, it is preferred that the n-impurity is present in the vicinity of the p-type impurity in the matrix ($CuInS_2$).

The p-type impurity added to $CuInS_2$ can include, for example, a IIa group element such as Be having a smaller number of electrons in the outermost shell than that of In, or a Vb group element such as P having the smaller number of electrons in the outermost shell than that of S. The n-type impurity can include, for example, a VIIb group element such as Cl having a larger number of electrons in the outermost shell than that of S, or a IVb group element such as S having a larger number of electrons in the outermost shell than that of In.

In view of the stability of crystals, it is preferred that each of the p-type impurity and the n-type impurity substitutes for each of In and S of the matrix independently of each other, rather than both of the p-type impurity and n-type impurity being substituted for In or S together. For this purpose, the combination of the p-type impurity and the n-type impurity added to $CuInS_2$ preferably includes a combination comprising a Vb group element for the p-type impurity and a IVb group element for the n-type impurity, or a combination comprising a IIa group element for the p-type impurity and a VIIb group element for the n-type impurity.

Among the combinations of the Vb group elements and the IVb group elements, it is preferred to use P, As or Sb as the Vb group element and Ge, Sn or Pb as the IVb group element, with both of the elements being present stably in $CuInS_2$ by increasing the covalent bond character.

Further, since the combination of the Ia group element and the VIIb group element gives a large difference of the electric negativity between the IIa group element and the VIIb group element, a coulombic attraction is caused between both of the elements added to the matrix. Then, both of the elements tend to be present adjacent each other in the matrix by the coulombic attraction. Accordingly, the combination of the IIa group element and the VIIb group element is preferred in view of the stabilization of the Cu—S bonds.

Since ionic bond character and the covalent bond character are present together in the Ib-IIIb-VIb2 group compound semiconductor as described above, if the p-type impurity and the n-type impurity are added in a combination giving an extremely large difference of the electric negativity (for example, a combination in which the p-type impurity is Be or Mg and the n-type impurity is F), the ionic bond character becomes extremely strong to lower the energy stability of the $CuInS_2$ crystals as the matrix. This induces elimination of the negative element or the like causing the crystals to be lost easily.

Accordingly, for stabilizing the Cu-S bonds while keeping the stability of the crystals of the matrix, it is necessary to choose a combination of the p-type impurity and the n-type impurity to be added in which the difference of the electric negativity has such a value that both of the impurities exist adjacent each other, but it is not extremely large. Such a combination is preferably a combination in which the p-type impurity is Be and/or Mg forming a shallow acceptor level and the n-type impurity is at least one of Cl, Br and I.

Further, the Vb group element as the p-type impurity to $CuInS_2$ sometimes takes a valence other than −3 valence (for example, +3 valence), in which the Vb group element may possibly substitute not for S but for In. In order to avoid this and substitute the Vb group element for S for easy formation of an acceptor, it is preferred to strengthen the negativity of the Vb group element upon doping. That is, it is preferred to supply the Vb group element in the form of a compound with In (for example, InP, InSb) or in the form of a compound with Cu (for example, $Cu_3P$) or, further, in the form of a compound with an alkali metal element (for example, $Na_3P$, or $Li_3Sb$).

It has been known that addition of an alkali metal element such as Na to a $Ib-IIIb-VIb_2$ group compound semiconductor is effective to improve the conversion efficiency of a solar cell. Also in this invention, the same effect can be obtained by adding an alkali metal element together with the p-type impurity and the n-type impurity.

As described above, since an impurity other than the constituent elements of the Ib-IIb-VIb, group compound semiconductor (for example, Cu, In, S of $CuInS_2$) is doped as the n-type impurity in the method of the present invention, the addition amount of the acceptor defect (p-type impurity) and the donor defect (n-type impurity) can be controlled accurately and no different phase of high resistivity is present together, which is different from the known method of partial substitution of In atoms as the constituent elements of $CuInS_2$ for Cu atoms. Accordingly, the method of the present invention is effective both in view of the easiness of manufacture and the performance of the obtained p-type semiconductor.

In the method of the present invention, the p-type impurity and the n-type impurity may be added to the $Ib$-$IIIb$$VIb_2$ group compound semiconductor either simultaneously or separately but, if the p-type impurity is added before the n-type impurity, donor defects are generated which are induced by the elimination of the negative element as described above at the instant the p-type impurity is added. Accordingly, it is preferred that the n-type impurity is added simultaneously with the addition of the p-type impurity or prior to the addition of the p-type impurity.

Particularly, when the p-type impurity and the n-type impurity are added simultaneously, both of the impurities tend to easily be present adjacent each other in the matrix and they tend to be easily present homogeneously over the entire matrix, so that the effect of the present invention is enhanced extremely. Particularly, a combination in which the chemical bonding strength is strong between the p-type impurity and the n-type impurity (for example, Be and Cl) is preferred since the tendency described above becomes remarkable.

An optimal method of forming the p-type semiconductor according to the present invention differs depending, for example, on the kind of the compound semiconductor as the matrix or on the form thereof, that is, whether it is a bulk or a thin film, but all of known methods can be utilized basically.

For instance, in the case of a thin film, elements constituting the compound semiconductor as the matrix and the p-type impurity and the n-type impurity may be supplied simultaneously and formed into a film by an MBE method or a CVD method, or a thin film of the compound semiconductor as the matrix is formed by the MBE method or the CVD method and, subsequently, the p-type impurity and the n-type impurity may be added by ion implantation or thermal difflusion to the thin film. Since this method can provide a film of a good quality, it is generally used frequently as the method of forming a single crystal layer which is predominantly utilized, for example, in light emitting elements.

Further, a method of manufacturing a p-type $CuInS_2$ film suitable as a constituent material for a solar cell can include an evaporation method of supplying the constituent elements simultaneously or a sulfurization method of forming, for example, a CuIn alloy film, a lamination film of Cu and In or a CuInS alloy film and then applying a heat treatment to the film in a S-containing atmosphere.

In the evaporation method, constituent elements which are solid at a room temperature (for example, Mg, Sn and Sb) are usually supplied in the form of molecular beams by heating materials comprising the elements in K cells. Further, if it is difficult to control the amount of supply in the elemental form, for example, an element in a case of which is solid at a room temperature and shows a high vapor pressure (for example, P or I), the element is formed into a compound with Cu or In as a constituent element of the matrix (solid material for example, CuI or InP) or with other doping element and may be supplied in the form of molecular beams by heating the compound in a K cell.

Cl in the form of $Cl_2$ and Br in the form of $Br_2$ are supplied to a vacuum chamber each in a gaseous state. The Br is supplied, after Br which is liquid at a room temperature is vaporized into a form of $Br_2$ by heating outside the chamber. If necessary, the gas may be activated by using high frequency coils such that the doping element can be taken easily into the $CuInS_2$ thin film. Further, as described previously, the element may also be in the form of a compound with the constituent element of the matrix (solid material such as CuCl, $InCl_3$, $MgCl_2$) or with other doping element and the compound may be supplied in the form of molecular beams by heating in a K cell.

When the doping element is added in a gaseous state at a high concentration, an increase of the growing pressure during vapor deposition gives rises to a problem, but this can be suppressed by supplying the element in the form of molecular beams. Accordingly, for forming a high quality thin film, it is preferred also for Cl or Br to be supplied in the form of a compound with a constituent element for the matrix or with the other doping element.

The sulfurizing method includes a method of forming a CuIn (or CuInS) alloy film containing a doping element and then applying a heat treatment to the film in an S-containing atmosphere. In this case, the method of forming the film containing the doping element can include a method of conducting simultaneous sputtering from a target of the doping element upon forming the film, a method of at first forming a film of the doping element and forming to laminate an alloy film thereon, a method of at first forming an alloy film and then forming to laminate a film of the doping element thereon or a method of forming a film by sputtering from a target with addition of the doping element to an alloy (for example, Cu, In, CuIn or CuInS).

Further, there is also a method of supplying a gaseous doping element simultaneously with an S-containing gas upon sulfurization of a CuIn (or CuInS) alloy film in the S-containing gas atmosphere, thereby adding the doping element to the film.

Other methods of forming a p-type $CnInS_2$ than the evaporation method and the sulfuirization method described above can include also a method of at first forming a $CuInS_2$ thin film and adding thereto a doping element by ion implantation. In this case, for improving the crystallinity lowered by ion implantation, it is necessary to apply a heat treatment. The heat treatment is preferably conducted in the S-containing gas atmosphere in order to prevent elimination of S upon heat treatment.

The present invention also provides a semiconductor device having, as a constituent material, a p-type semiconductor containing a p-type impurity and an n-type impurity to the $Ib$-$IIIb$-$VIb_2$ group compound semiconductor described above.

Further, the present invention provides a photovoltaic device having an n-type semiconductor layer, a first p-type semiconductor layer, a second p-type semiconductor layer having a higher p-type carrier concentration than that in the first p-type semiconductor layer and an electrode layer in this order, wherein the first p-type semiconductor layer and the second p-type semiconductor layer comprise a p-type semiconductor containing a p-type impurity and an n-type impurity in an $Ib$-$IIIb$-$VIb_2$ group compound semiconductor.

The photovoltaic device (solar cell, photodiode, etc.) is a photovoltaic device of a BSF (Back Surface Field) structure, and decrease of a photocurrent caused by the thin film configuration can be suppressed by adopting the BSF structure.

Further, the present invention provides a semiconductor device in which a p-type semiconductor containing a p-type impurity and an n-type impurity in an Ib-IIIb-VIb$_2$ group compound semiconductor and an n-type semiconductor having an Ib-IIb-VIb$_2$ group compound semiconductor as a matrix are joined.

The n-type semiconductor of the semiconductor device may be obtained by adding both of the n-type impurity and the p-type impurity to the Ib-IIb-VIb$_2$ group compound semiconductor such that the content of the n-type impurities is higher.

The semiconductor device includes a device in which the Ib-IIIb-VIb$_2$ group compound semiconductor as the matrix is identical between the p-type semiconductor and the n-type semiconductor is joined to each other (namely, pn homojunction) or is different between them.

If the semiconductor device has pn homojunction, it is preferred to adopt a method of supplying a Ib group element, a IIIb group element, a VIb group element and an impurity simultaneously into a film deposition apparatus, thereby directly obtaining a semiconductor layer containing the impurity as the method of forming the p-type semiconductor and the n-type semiconductor, and forming both of the semiconductor layers that form the pn homojunction having an identical Ib-IIb-VIb$_2$ group compound semiconductor as the matrix continuously in one identical film deposition apparatus.

Specifically, if both of the p-type semiconductor and the n-type semiconductor of the semiconductor device contain both of the p-type and n-type impurities, the Ib group element, the IIIb group element, the VIb group element, the p-type impurity and the n-type impurity are supplied into a film deposition apparatus simultaneously and such that the p-type impurity concentration is higher than the n-type impurity concentration to form a p-type semiconductor and, subsequently, the amount of the p-type impurity and/or the ntype impurity supplied is changed such that the n-type impurity concentration is higher than the p-type impurity concentration to form the n-type semiconductor in the identical apparatus.

Further, if only the p-type semiconductor of the semiconductor device contains both of the p-type and n-type impurities, the p-type semiconductor is formed in the same manner as described above and then only the supply of the p-type impurity is interrupted to form the n-type semiconductor in one identical apparatus.

BEST MODE FOR PRACTICING THE INVENTION

An embodiment of the present invention will now be explained with reference to specific examples.

EXAMPLE 1

Identical glass substrates were provided, and a CuInS$_2$ layer with no doping element was formed at first directly on one of them or by way of Mo coated to a thickness of 1 μm on the other of them as described below.

Namely, a CuInS film was formed by a reactive sputtering method using Cu and In as targets and a gas mixture of H$_2$S+Ar (H$_2$S concentration: 8%) as a sputtering gas. The substrate was not heated during the sputtering. Then, the CuInS film was heat treated at a temperature of 550° C. in an atmosphere of H$_2$S+Ar gas mixture (H$_2$S concentration: 5%) to obtain a CuInS$_2$ film.

Then, Sn (n-type impurity) and P (p-type impurity) were ion implanted to the CuInS$_2$ film in the order of Sn and P. In this way, a CuInS$_2$ film containing both of the p-type impurity and the n-type impurity was obtained. The conditions of the ion implantation are as shown below.

ION IMPLANTATION CONDITION

Sn Implantation:

Energy: 10(KeV), implantation amount: $1\times10^{15}$ (cm$^{-2}$)

P Implantation:

Energy: 10(KeV), implantation amount: $2\times10^5$ (cm$^{-2}$)

Further, for recrystallizing the CuInS$_2$ film, the crystallinity of which was lowered by ion implantation, the CuInS$_2$ film after implantation was heat treated in H$_2$S+Ar (H$_2$S concentration: 5%) at a temperature of 520° C.

When the thickness of the thus formed CuInS$_2$ film was measured by a step gauge, it was 2.0 μm. When electric characteristics of the CuInS$_2$ film formed directly on the glass substrate were examined by hole measurement using a van der Pauw method, it exhibited a p-type conduction at a carrier concentration of $5\times10^{17}$ (cm$^{-3}$).

When the Sn and P concentrations in the CuInS$_2$ film were measured by using a secondary ion mass spectrometer (IMA-3, manufactured by Hitachi Ltd.), P was about $1\times10^{19}$ (cm$^{-3}$) and Sn was about $5\times10^{18}$ (cm$^{-3}$).

Figure 1:
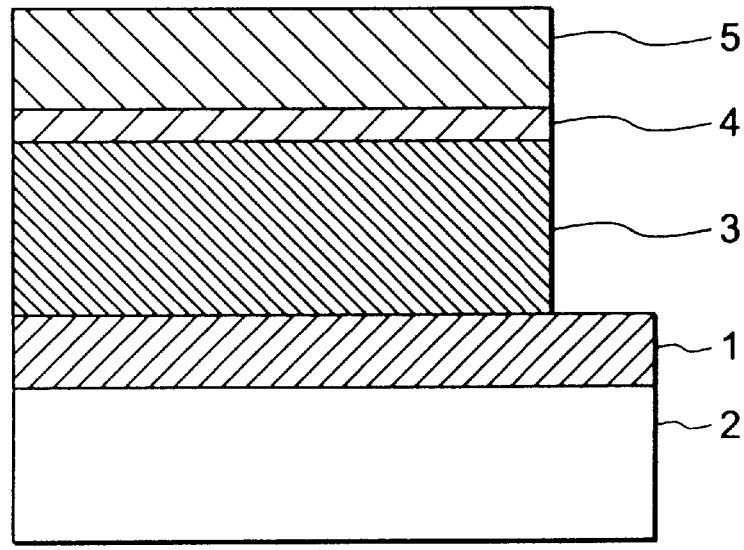
FIG. 1 is a schematic cross sectional view showing a structure of a thin film solar cell formed in Examples 1 to 9 and Comparative Examples 1 to 5.

Further, for the glass substrate on which the CuInS$_2$ film was formed by way of the Mo layer, a CdS layer as the n-type semiconductor layer was formed by a chemical bath deposition on the CuInS$_2$ layer and an ITO (Indium-Tin oxide) as a transparent electrode layer was further formed thereover by an RF sputtering method. In this way, a thin film solar cell of a layered structure having, on a glass substrate 2, a Mo layer (Mo electrode) 1, a CuInS$_2$ layer (p-type semiconductor layer) 3, a CdS layer (n-type semiconductor layer) 4 and an ITO layer (ITO electrode) 5 as shown in FIG. 1 was manufactured. The thickness of the CdS layer 4 was 80 nm and the thickness of the ITO layer 5 was 0.8 μm.

The conversion efficiency of the solar cell was 12% when measured by a solar simulator (AM 1.5, 100 mW/cm$^2$).

EXAMPLE 2

Identical glass substrates were provided and a CuInS$_2$ layer with no doping element was at first formed directly on one of them or by way of Mo coated to a thickness of 1 μm on the other of them as described below.

Namely, a CuInS film was formed by a reactive sputtering method using Cu and In as targets and a gas mixture of H$_2$S+Ar (H$_2$S concentration: 8%) as a sputtering gas. The substrate was not heated during the sputtering. Then, the CuInS film was heated at a temperature of 550° C. in an atmosphere of H$_2$S+Ar gas mixture (H$_2$S concentration: 5%), to obtain a CuInS$_2$ film.

Then, Si (n-type impurity) and P (p-type impurity) were ion implanted to the CuInS$_2$ film in the order of Si and P. In this way, a CuInS$_2$ film containing both of the impurity and the n-type impurity was obtained. The conditions of the ion implantation are as shown below.

ION IMPLANTATION CONDITION

Si Implantation:

Energy: 10(KeV), implantation amount: $1\times10^{15}$ (cm$^{-2}$)

P Implantation:

Energy: 10(KeV), implantation amount: $2\times10^{15}$ (cm$^{-2}$)

Further, for recrystallizing the CuInS$_2$ film with the crystallinity of which was lowered by ion implantation, the CuInS$_2$ film after implantation was heat treated in H$_2$S+Ar (H$_2$S concentration: 5%) at a temperature of 520° C.

When the film thickness of the thus formed CuInS$_2$ layer was measured by a step gauge, it was 2.0 μm. When electric characteristics of the CuInS$_2$ film formed directly on the glass substrate were examined by hole measurement using a van der Pauw method, it exhibited a p-type conduction at a carrier concentration of $2\times10^{17}$ (cm$^{-3}$).

When the P and Si concentrations in the CuInS$_2$ film were measured by the same manner as in Example 1, P was about $1\times10^{19}$ (cm$^{-3}$) and Si was about $5\times10^{18}$ (cm$^{-3}$).

Further, for the glass substrate in which the CuInS$_2$ film was formed by way of the Mo layer, a CdS layer and an ITO layer were formed successively in the same way as in Example 1, to manufacture a thin film solar cell.

The conversion efficiency of the solar cell was 10% when measured by a solar simulator (AM 1.5, 100 mW/cm$^2$).

COMPARATIVE EXAMPLE 1

Identical glass substrates were provided and a CuInS$_2$ with no doping element was formed directly on one of them and by way of Mo coated to a thickness of 1 μm on the other of them and then In and P were doped by ion implantation to the CuInS$_2$ layer, to form a CuInS$_2$ layer containing P (p-type impurity) as a doping element in CuInS$_2$ in which In atoms substituted for Cu atoms partially.

The CuInS$_2$ layer with no doping element was formed as below. Namely, a CuInS film was formed by a reactive sputtering method using Cu and In as targets and a gas mixture of H$_2$S+Ar (H$_2$S concentration: 8%) as a sputtering gas. The substrate was not heated during the sputtering. Then, the CuInS film was heat treated at a temperature of 550° C. in an atmosphere of H$_2$S+Ar gas mixture (H$_2$S concentration: 5%) to obtain a CuInS$_2$ layer.

The ion implantations were conducted in the order of In and P under the following conditions.

ION IMPLANTATION CONDITION

In Implantation:

Energy: 10(KeV), implantation amount: $1\times10^{15}$ (cm$^{-2}$)

P Implantation:

Energy: 10(KeV), implantation amount: $2\times10^{15}$ (cm$^{-2}$)

Further, for recrystallizing the CuInS$_2$ film, the crystallinity of which was lowered by ion implantation, the CuInS$_2$ film after implantation was heat treated in H$_2$S+Ar (H$_2$S concentration: 5%) at a temperature of 520° C.

When the thickness of the thus formed CuInS$_2$ film was measured by a step gauge, it was 2.0 μm. When electric characteristics of the CuInS$_2$ film formed directly on the glass substrate were examined by hole measurement using a van der Pauw method, it exhibited a p-type conduction at a carrier concentration of $5\times10^{16}$ (cm$^{-3}$).

When the P concentration in the CuInS$_2$ layer was measured in the same manner as in Example 1, it was about $1\times10^{19}$ (cm$^{-3}$). Since the In is a constituent element of the matrix, the concentration of In substituted for Cu could not be measured.

Further, for the glass substrate on which the CuInS$_2$ layer was formed by way of the Mo layer, a CdS layer and an ITO layer were formed successively on the CuInS$_2$ layer in the same manner as in Example 1, to manufacture a thin film solar cell.

The conversion efficiency of the solar cell was 8% when measured by a solar simulator (AM 1.5, 100 mW/cm$^2$).

COMPARATIVE EXAMPLE 2

A CuInS$_2$ layer was formed in the same manner as in Example 1 except for ion implanting only P (p-type impurity) by the identical amount. When electric characteristics of the CuInS$_2$ layer were measured in the same manner as in Example 1, it showed a p-type conduction at a carrier concentration of $3\times10^{15}$ (cm$^{-3}$).

When the P concentration in the CuInS$_2$ layer was measured in the same manner as in Example 1, it was about $1\times10^{19}$ (cm$^{-3}$).

A solar cell shown in FIG. 1 was manufactured in the same manner as in Example 1 except for forming the CuInS$_2$ layer ion implanted only with P as the p-type semiconductor layer 3. The conversion efficiency of the solar cell was 4% when measured by a solar simulator under the same condition as in Example 1.

EXAMPLE 3

Identical glass substrates were provided, and a CuInS$_2$ layer containing P (p-type impurity) and Sn (n-type impurity) as doping elements was formed directly on one of them or by way of Mo coated to a thickness of 1 μm on the other of them as described below.

First, a CuInS layer containing P and Sn was formed on the glass substrate or on the Mo layer respectively. The CuInS layer was formed by using an In-Sn alloy target placing an InP pellet thereon and a Cu target and conducting sputtering simultaneously in an atmosphere of a gas mixture of H$_2$S+Ar (H$_2$S concentration: 8%). The substrate was not heated during the sputtering. Then, the CuInS film containing P and Sn was heat treated at a temperature of 550° C. in an atmosphere of a gas mixture of H$_2$S+Ar (H$_2$S concentration: 5%).

When the film thickness of the that formed CuInS$_2$ layer was measured by a step gauge, it was 2.0 μm. When electric characteristics of the CuInS$_2$ layer formed directly on the glass substrate were examined by hole measurement using a van der Pauw method, it showed a p-type conduction at a carrier concentration of $5\times10^{17}$ (cm$^{-3}$).

When the P and Sn concentrations in the CuInS$_2$ film were measured by the same manner as in Example 1, P was about $1\times10^{19}$ (cm$^{-3}$) and Sn was about $5\times10^{18}$ (cm$^{-3}$).

Further, for the glass substrate on which the CuInS$_2$ film was formed by way of the Mo layer, a CdS layer and an ITO layer were formed successively on the CuInS$_2$ layer, to manufacture a thin film solar cell.

The conversion efficiency of the solar cell was 13% when measured by a solar simulator (AM 1.5, 100 mW/cm$^2$).

EXAMPLE 4

Identical glass substrates were provided, and a CuInS$_2$ layer containing P (p-type impurity) and Sn (n-type impurity element) was formed directly on one of them or by way of Mo coated to a thickness of 1 gm on the other of them quite in the same way as in Example 3 except for using an In—Sn alloy target with an Sn concentration about 2/5 of that in Example 3.

When the film thickness of the that formed CuInS$_2$ layer was measured by a step gauge, it was 2.0 μm. When electric characteristics of the $CuInS_2$ layer formed directly on the glass substrate were examined by hole measurement using a van der Pauw method, it showed a p-type conduction at a carrier concentration of $1\times10^{17}$ $(cm^{-3})$.

When the P and Sn concentrations in the $CuInS_2$ layer were measured in the same manner as in Example 1, P was about $1\times10^{19}$ $(cm^{-3})$ and Sn was about $2\times10^{18}$ $(cm^{-3})$.

Further, for the glass substrate on which the $CuInS_2$ layer was formed by way of the Mo layer, a CdS layer and an ITO layer were formed successively in the same manner as in Example 1 on the $CuInS_2$ layer, to manufacture a thin film solar cell.

The conversion efficiency of the solar cell was 10% when measured by a solar simulator (AM 1.5, 100 $mW/cm^{-2}$).

In Example 4, the content of the p-type impurity is 5.0 times the content of the n-type impurity and since it is out of the definition that "the content of the p-type impurity is 1.3 to 3.0 times the content of the n-type impurity", the carrier concentration and the conversion efficiency are somewhat lowered compared with Examples 1 and 3 having 2.0 times.

EXAMPLE 5

Identical glass substrates were provided and a $CuInS_2$ layer containing P (p-type impurity) and Cl (n-type impurity) as doping elements was formed directly on one of them or by way of Mo coated to a thickness of 1 μm to the other of them as shown below.

First, a CuInS layer containing P and Cl was formed on the glass substrate or on the Mo layer. The CuInS layer was formed by placing an InP pellet on an In target and placing a CuCl pellet on a Cu target and sputtering simultaneously in an atmosphere of a gas mixture of $H_2S+Ar$ ($H_2S$ concentration: 8%). The substrate was not heated during the sputtering. Then, the CuInS film containing P and Cl was heat treated at a temperature of 550° C. in an atmosphere of $H_2S+Ar$ gas mixture ($H_2S$ concentration: 5%).

When the film thickness of the thus formed $CuInS_2$ layer was measured by a step gauge, it was 2.0 μm. When electric characteristics of the $CuInS_2$ layer formed directly on the glass substrate were examined by hole measurement using a van der Pauw method, it showed a p-type conduction at a carrier concentration of $3\times10^{17}(cm^{-3})$.

When the P and Cl concentrations in the $CuInS_2$ layer were measured in the same manner as in Example 1, P was about $1\times10^{19}$ $(cm^{-3})$ and Cl was about $5\times10^{18}$ $(cm^{-3})$.

Further, for the glass substrate on which the $CuInS_2$ layer was formed by way of the Mo layer, a CdS layer and an ITO layer were formed successively in the same manner as in Example 1 on the $CuInS_2$ layer, to manufacture a thin film solar cell.

The conversion efficiency of the solar cell was 11% when measured by a solar simulator (AM 1.5, 100 $mW/cm^2$).

COMPARATIVE EXAMPLE 3

A $CuInS_2$ layer was formed in the same manner as in Example 4 except for doping only with P (p-type impurity) by an identical amount.

When the electric characteristics of the $CuInS_2$ layer were measured in the same manner as in Example 1, it showed a p-type conduction at a carrier concentration of $7\times10^{15}$ $(cm^{-3})$. When the P concentration in the $CuInS_2$ layer was measured in the same manner as in Example 1, it was about $1\times10^{19}$ $(cm^{-3})$.

A solar cell as shown in FIG. 1 was manufactured in the same manner as in Example 1 except for forming the $CuInS_2$ layer doped only with P as the p-type semiconductor layer 3. The conversion efficiency of the solar cell was 5% when measured by a solar simulator under the same condition in Example 1.

EXAMPLE 6

Identical glass substrates were provided and a $CuInS_2$ layer containing Be (p-type impurity) and Cl (n-type impurity) as doping elements was formed by an evaporation method directly on one of them or by way of Mo coated to a thickness of 1 μm on the other of them. Cu, In, S and Be each in the elemental form and Cl in the form of CuCl were heated respectively in K cells into molecular beams, which were supplied to the substrate. Further, the substrate temperature during the deposition was 550° C.

When the film thickness of the thus formed $CuInS_2$ layer was measured by a step gauge, it was 2.0 μm. When electric characteristics of the $CuInS_2$ layer formed directly on the glass substrate were examined by hole measurement using a van der Pauw method, it showed a p-type conduction at a carrier concentration of $5\times10^{17}$ $(cm^{-3})$.

When the Be and Cl concentrations in the $CuInS_2$ layer were measured in the same manner as in Example 1, Be was about $1\times10^{19}$ $(cm^{-3})$ and Cl was about $5\times10^{18}$ $(cm^{-3})$.

Further, for the glass substrate on which the $CuInS_2$ layer was formed by way of the Mo layer, a CdS layer and an ITO layer were formed successively on the $CuInS_2$ layer in the same manner as in Example 1, to manufacture a thin film solar cell.

The conversion efficiency of the solar cell was 13% when measured by a solar simulator (AM 1.5, 100 $mW/cm^2$).

EXAMPLE 7

Identical glass substrates were provided and a $CuInS_2$ layer containing Be (p-type impurity) and F (n-type impurity) as doping elements was formed by an evaporation method directly on one of them or by way of Mo coated to a thickness of 1 μm on the other of them. Cu, In, S and Be each in the elemental form and F in the form of CuF were heated respectively in K cells into molecular beams, which were supplied to the substrate. Further, the substrate temperature during the deposition was 550° C.

When the film thickness of the thus formed $CuInS_2$ layer was measured by a step gauge, it was 2.0 μm. When electric characteristics of the $CuInS_2$ layer formed directly on the glass substrate were examined by hole measurement using a van der Pauw method, it showed a p-type conduction at a carrier concentration of $1\times10^{17}$ $(cm^{-3})$.

When the Be and F concentrations in the $CuInS_2$ layer were measured in the same manner as in Example 1, Be was about $1\times10^{19}$ $(cm^{-3})$ and F was about $5\times10^{18}$ $(cm^{-3})$.

Further, for the glass substrate on which the $CuInS_2$ layer was formed by way of the Mo layer, a CdS layer and an ITO layer were formed successively on the $CuInS_2$ layer in the same manner as in Example 1, to manufacture a thin film solar cell.

The conversion efficiency of the solar cell was 10% when measured by a solar simulator (AM 1.5, 100 $mW/cm^2$).

EXAMPLE 8

Identical glass substrates were provided and a $CuInS_2$ layer containing Be (p-type impurity) and Sn (n-type impurity) as doping elements was formed by an evaporation method directly on one of them or by way of Mo coated to a thickness of 1 μm on the other of them. Cu, In, S, Be and Sn each in the elemental form were heated respectively in K cells into molecular beams, which were supplied to the substrate. Further, the substrate temperature during the deposition was 550° C.

When the film thickness of the thus formed $CuInS_2$ layer was measured by a step gauge, it was 2.0 μm. When electric characteristics of the $CuInS_2$ layer formed directly on the glass substrate were examined by hole measurement using a van der Pauw method, it showed a p-type conduction at a carrier concentration of $2\times10^{17}(cm^{-3})$.

When the Be and Sn concentrations in the $CuInS^2$ layer were measured in the same manner as in Example 1, Be was about $1\times10^{19}$ $(cm^{-3})$ and Sn was about $5\times10^{18}$ $(cm^{-3})$.

Further, for the glass substrate on which the $CuInS_2$ layer was formed by way of the Mo layer, a CdS layer and an ITO layer were formed successively on the $CuInS_2$ layer in the same manner as in Example 1, to manufacture a thin film solar cell.

The conversion efficiency of the solar cell was 10% when measured by a solar simulator (AM 1.5, 100 mW/cm²).

COMPARATIVE EXAMPLE 4

A $CuInS_2$ layer was formed in the same manner as in Example 5 except for doping only with Be (p-type impurity) by an identical amount.

When the electric characteristics of the $CuInS_2$ layer were measured in the same manner as in Example 1, it showed a p-type conduction at a carrier concentration of $3\times10^{15}$ $(cm^{-3})$. When the Be concentration in the $CuInS_2$ layer was measured in the same manner as in Example 1, it was about $1\times10^{19}$ $(cm^{-1})$.

A solar cell as shown in FIG. 1 was manufactured in the same manner as in Example 1 except for forming the $CuInS^2$ layer doped only with Be as the p-type semiconductor layer 3. The conversion efficiency of the solar cell was 4% when measured by a solar simulator under the same conditions as in Example 1.

EXAMPLE 9

Identical glass substrates were provided and a $CuInS_2$ layer containing Sb (p-type impurity) and I (n-type impurity) as doping elements was formed by an evaporation method directly on one of them or by way of Mo coated to a thickness of 1 μm on the other of them. Cu, In, Se and Sb each in the elemental form and I in the form of CuI were heated respectively in K cells into molecular beams, which were supplied to the substrate. Further, the substrate temperature during the deposition was 500° C.

When the film thickness of the formed $CuInS_2$ layer was measured by a step gauge, it was 2.0 μm. When electric characteristics of the $CuInS_2$ layer formed directly on the glass substrate were examined by hole measurement using a van der Pauw method, it showed a p-type conduction at a carrier concentration of $5\times10^{17}$ $(cm^{-3})$.

When the Sb and I concentrations in the $CuInS_2$ layer were measured in the same manner as in Example 1, Sb was about $1\times10^{19}$ $(cm^{-3})$ and I was about $5\times10^{18}$ $(cm^{-3})$.

Further, a thin film solar cell shown in FIG. 1 was manufactured in the same manner as in Example 1 except for forming the $CuInS_2$ layer doped with Sb and I as the p-type semiconductor layer 3.

The conversion efficiency of the solar cell was 13% when measured by a solar simulator (AM 1.5, 100 mW/cm²) under the same conditions as in Example 1.

COMPARATIVE EXAMPLE 5

A $CuInSe_2$ layer was formed in the same manner as in Example 9 except for doping only with Sb (p-type impurity) by an identical amount.

When the electric characteristics of the $CuInS_2$ layer were measured in the same manner as in Example 1, it showed a p-type conduction at a carrier concentration of $8\times10^{16}$ $(cm^{-3})$. When the Sb concentration in the $CuInS_2$ layer was measured in the same manner as in Example 1, it was about $1\times10^{19}$ $(cm^{-3})$.

A solar cell as shown in FIG. 1 was manufactured in the same manner as in Example 1 except for forming the $CuInSe_2$ layer doped only with Sb as the p-type semiconductor layer 3. The conversion efficiency of the solar cell was 11% when measured by a solar simulator under the same conditions as in Example 1.

EXAMPLE 10

Figure 2:
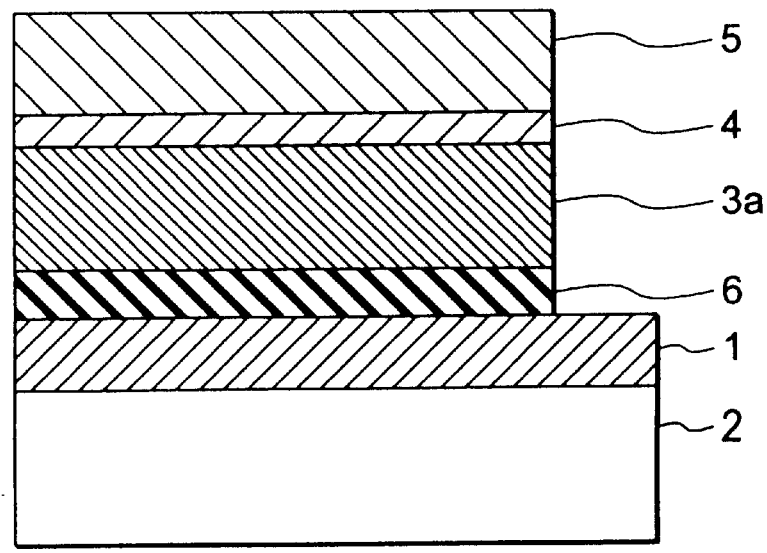
FIG. 2 is a schematic cross sectional view showing a structure of a thin film solar cell of a BSF structure formed in Example 10.

A thin film solar cell of the BSF (B3ack Surface Field) structure shown in FIG. 2 was manufactured by substantially the same procedures as those in Example 3. Different from Example 3, a $CuInS_2$ layer 6 was formed to a thickness of 0.2 μm between an Mo layer 1 and a $CumnS_2$ layer 3 (first p-type semiconductor layer 3a), with the p-type carrier concentration being higher than that of the first p-type semiconductor layer 3a, as a second p-type semniconductor layer.

That is, the $CuInS_2$ layer (second p-type semiconductor layer) 6 was formed in the same manner as the $CuInS_2$ layer 3 was formed in Example 3 except for using an InSn alloy target of a higher Sn content than that used when the CuInS layer was formned for forming the $CuInS_2$ layer 3 in Example 3, and increasing the amount of the InIP pellet placed thereon upon forming the CuInS layer containing P and Sn. The first p-type semiconductor layer 3a identical with the $CuInS_2$ layer 3 in Example 3 was formed on the $CuInS_2$ layer (second p-type semiconductor layer) 6.

The electric characteristics and P and Sn concentrations of the $CuIns_2$ layer 6 were measured in the same manner as in Example 1 by forming the $CuInS_2$ layer containing P and Sn to a thickness of 2.0 μm on the glass substrate under the same condition as that for forming on the Mo layer 1. As a result, the p-type carrier concentration was $1\times10^{19}$ $(cm^{-3})$, the P concentration was about $2\times10^{20}$ $(cm^{-3})$ and the Sn concentration was about $1\times10^{20}$ $(cm^{-3})$.

The conversion efficiency of the solar cell was 13.5% when measured by a solar simulator (Am 1.5, 100 mW/cm⁻3).

That is, since the carrier concentration can be increased to about $1\times10^{19}$ $(cm^{-3})$ in the p-type semiconductor obtained by adding both of the P (p-type impurity) and the Sn (n-type impurity) to $CuInS_2$, a thin film solar cell of the BSF structure having high conversion efficiency can be obtained as in this example, having the Mo layer (electrode) 1, the $CuInS_2$ layer (second p-type semiconductor layer) 6 at a carrier concentration of $1\times10^{19}$ $(cm^{-3})$ and the $CuInS_2$ layer (first p-type semiconductor layer) 3a at a carrier concentration of $5\times10^{17}$ $(cm^{-3})$ in this order.

EXAMPLE 11

Figure 3:
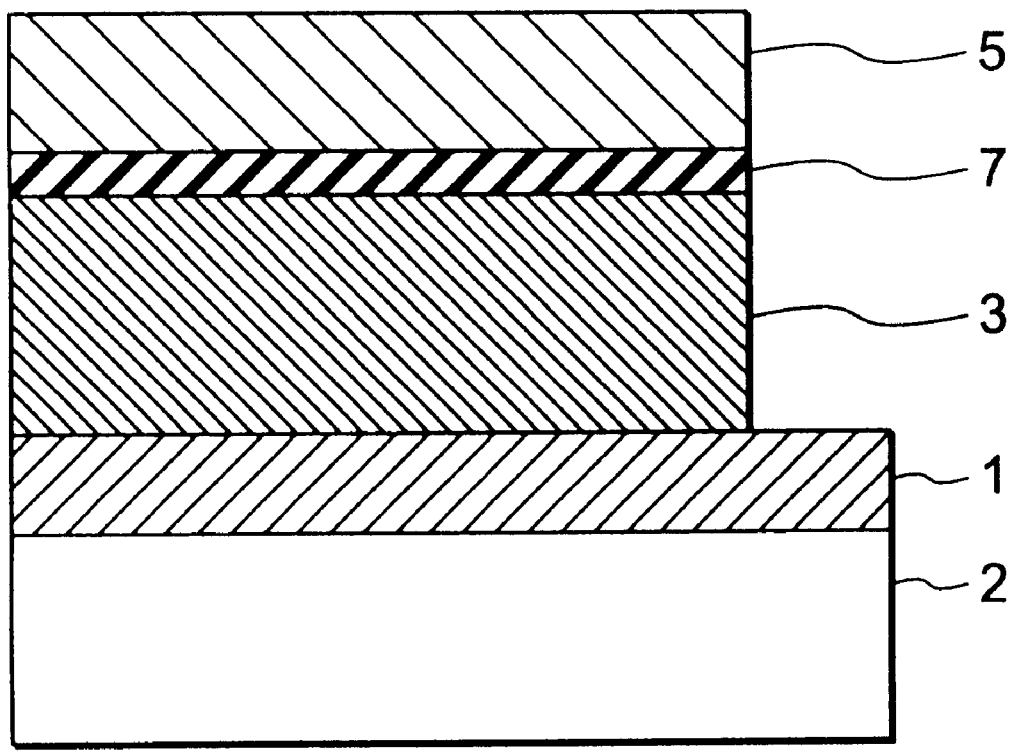
FIG. 3 is a schematic cross sectional view showing a structure of a pn homojunction type thin film solar cell formed in Example 11.

A pn homojunction type thin film solar cell as shown in FIG. 3 was manufactured by the following procedures.

At first, in the same manner as in Example 6, a $CuInS_2$ layer 3 was formed by way of a Mo layer 1 on a glass substrate 2 by an evaporation method.

That is, Cu, In, S and Be each in the elemental form and Cl in the form of CuCl were heated respectively in K cells into molecular beams, which were supplied into a vacuum apparatus. Thus, a CuInS$_2$ layer 3 was formed in which p-type carrier concentration was $5\times10^{17}$ (cm$^{-3}$), and Be and Cl concentrations were about $1\times10^{19}$ (cm$^{-3}$) for Be and about $5\times10^{18}$ (cm$^{-3}$) for Cl.

Then, only the supply of Be as the p-type impurity was interrupted and the evaporation was continued to form an n-type CuInS$_2$ layer 7 doped only with CI of the n-type impurity on the p-type CuInS$_2$ layer 3. Then, an ITO layer 5 was formed on the n-type CuInS$_2$ layer 7 in the same manner as in Example 1.

The conversion efficiency of the solar cell was 13.5% when measured by a solar simulator under the same condition as in Example 1.

As described above, if the evaporation method is adopted for the method of manufacturing a semiconductor device having a pn homojunction with CuInS$_2$ being the matrix and forming the p-type CuInS$_2$ layer by adding both of the p-type impurity and the n-type impurity, since the n-type CuInS$_2$ layer can be formed continuously by interrupting the supply of the p-type impurity after forming the p-type CuInS$_2$ layer, the production efficiency is improved compared with other methods such as an ion implantation.

INDUSTRIAL APPLICATION

As has been described above, in the p-type semiconductor according to the present invention, the p-type carrier concentration takes a value corresponding to the content of the p-type impurity by the presence of the n-type impurity added together with the p-type impurity to the Ib-IIIb-VIb2 group compound semiconductor. Further, a high performance semiconductor device can be realized by the p-type semiconductor.

According to the method of manufacturing the p-type semiconductor of the present invention, a p-type semiconductor at a high carrier concentration corresponding to the content of the p-type impurity can be obtained by adding the n-type impurity together with the p-type impurity to the Ib-IIIb-VIb2group compound semiconductor.

Further, according to this method, since the addition amounts of the p-type impurity and the n-type impurity can be controlled accurately, the determined carrier concentration can be realized more easily than in the known method for substituting the constituent elements in the Ib-IIIb-VIb2 group compound semiconductor with each other. Further, since no different phase of high resistivity is formed together, a p-type semiconductor of higher carrier concentration can be obtained.

Particularly, according to this method, a p-type carrier concentration higher than $1\times10^{17}$ (cm$^{-3}$), which could not be attained so far in the case of the matrix being CuInS$_2$ composed of a single chalcopyrite phase, can be attained. Further, the solar cell using the p-type CuInS$_2$ as the constituent material can provide a high conversion efficiency.

The method of manufacturing the semiconductor device according to the present invention has an effect of particularly enhancing the production efficiency as a method of forming a semiconductor device having a homojunction in which an n-type semiconductor having an identical matrix with the p-type semiconductor according to the present invention is joined to the p-type semiconductor.

What is claimed is:

1. A p-type semiconductor comprising (i) a p-type impurity selected from the group consisting of a group IIa element and a group Vb group element or both and (ii) an n-type impurity selected from the group consisting of a group IVb element and a group VIIb element, or both, contained in a group Ib-IIIb-VIb$_2$ compound semiconductor.

2. A p-type semiconductor as defined in claim 1, wherein the p-type impurity is a group IIa element and the n-type impurity is a group IVb element.

3. A p-type semiconductor as defined in claim 1, wherein the p-type impurity is Be, Mg, or both, and the n-type impurity is at least one of Ge, Sn and Pb.

4. A p-type semiconductor as defined in claim 1, wherein the p-type impurity is a group IIa element and the n-type impurity is a group VIIb element.

5. A p-type semiconductor as defined in claim 1, wherein the p-type impurity is Be, Mg, or both and the n-type impurity is at least one of Cl, Br and I.

6. A p-type semiconductor as defined in claim 1, wherein the p-type impurity is Be and the n-type impurity is Cl.

7. p-type semiconductor as defined in claim 1, wherein the p-type impurity is a group Vb element and the n-type impurity is a group IVb element.

8. A p-type semiconductor as defined in claim 1, wherein the p-type impurity is at least one of P, As and Sb and the n-type impurity is at least one of Ge, Sn and Pb.

9. A p-type semiconductor as defined in claim 1, wherein the p-type impurity is P and the n-type impurity is Sn.

10. A p-type semiconductor as defined in claim 1, wherein the p-type impurity is a group Vb element and the n-type impurity is a group VIIb element.

11. A p-type semiconductor as defined in claim 1, wherein the p-type impurity is at least one of P, As and Sb and the n-type impurity is at least one of Cl, Br and I.

12. A p-type semiconductor as defined in any one of claims 1 to 11, wherein the amount of the p-type impurity in the semiconductor is from 1.3 to 3.0 times the amount of the n-type impurity in the semiconductor.

13. A p-type semiconductor as defined in claim 1, wherein the group Ib-IIb-VIb$_2$ compound semiconductor is CuInS$_2$.

14. A p-type semiconductor at a carrier concentration of $1\times10^{17}$ (cm$^{-3}$) or higher, comprising a p-type impurity and an n-type impurity in CuInS$_2$ composed of a single chalcopyrite phase.

15. A method of manufacturing a p-type semiconductor comprising adding (i) a p-type impurity selected from the group consisting of a group IIa element, a group Vb element, or both, and (ii) an n-type impurity selected from the group consisting of a group IVb element, a group VIIb element or both, to a group Ib-IIIb-VIb$_2$ compound semiconductor in amounts such that the amount of the added p-type impurity is higher than that of the added n-type impurity.

16. A method of manufacturing a p-type semiconductor as defined in claim 15, wherein the n-type impurity is added simultaneously with or prior to the addition of the p-type impurity to the compound semiconductor.

17. A method of manufacturing a p-type semiconductor as defined in claim 15 or 16, wherein the p-type impurity is a group IIa element and the n-type impurity is a group IVb element.

18. A method of manufacturing a p-type semiconductor as defined in claim 15 or 16, wherein the p-type impurity is Be, Mg, or both, and the n-type impurity is at least one of Ge, Sn and Pb.

19. A method of manufacturing a p-type semiconductor as defined in claim 15 or 16, wherein the p-type impurity is a group IIa element and the n-type impurity is a group VIIb element.

20. A method of manufacturing a p-type semiconductor as defined in claim 15 or 16, wherein the p-type impurity is Be, Mg, or both, and the n-type impurity is at least one of Cl, Br and I. element.

21. A method of manufacturing a p-type semiconductor as defined in claim 15 or 16, wherein the p-type impurity is Be and the n-type impurity is Cl.

22. A method of manufacturing a p-type semiconductor as defined in claim 15 or 16, wherein the p-type impurity is a group Vb element and the n-type impurity is a group IVb element.

23. A method of manufacturing a p-type semiconductor as defined in claim 15 or 16, wherein the p-type impurity is at least one of P, As and Sb and the n-type impurity is at least one of Ge, Sn and Pb.

24. A method of manufacturing a p-type semiconductor as defined in claim 15 or 16, wherein the p-type impurity is P and the n-type impurity is Sn.

25. A method of manufacturing a p-type semiconductor as defined in claim 15 or 16, wherein the p-type impurity is a group Vb element and the n-type impurity is a group VIIb element.

26. A method of manufacturing a p-type semiconductor as defined in claim 15 or 16, wherein the p-type impurity is at least one of P, As and Sb and the n-type impurity is at least one of Cl, Br and I.

27. A method of manufacturing a p-type semiconductor as defined in claim 15 or 16, wherein the amount of the p-type impurity added is from 1.3 to 3.0 times the amount of the n-type impurity added.

28. A method of manufacturing a p-type semiconductor as defined in claim 15 or 16, wherein the group Ib-IIIb-VIb$_2$ compound is CuInS$_2$.

29. A semiconductor device comprising a p-type semiconductor as defined in claim 1.

30. A photovoltaic device comprising an n-type semiconductor layer, a first p-type semiconductor layer, a second p-type semiconductor layer at a higher p-type carrier concentration than that of the first p-type semiconductor layer and an electrode layer formed one on another in this order, wherein the first p-type semiconductor layer and the second p-type semiconductor layer each are a p-type semiconductor as defined in claim 1.

31. A semiconductor device comprising a p-type semiconductor as defined in claim 1, and an n-type semiconductor having a group Ib-IIIb-VIb compound semiconductor as the matrix joined to the p-type semiconductor.

32. A method of manufacturing a semiconductor device as defined in claim 31, which comprises forming a semiconductor layer containing impurities by simultaneously supplying a group Ib element, a group IIIb element, a group VIb element and impurities into a film deposition apparatus, and continuously forming in the apparatus films of both of a p-tvpe semiconductor and an n-type semiconductor, the films being joined and forming a pn homojunction having an identical group Ib-IIIb-VIb, compound semiconductor as a matrix.

33. A semiconductor device comprising a p-type semiconductor manufactured by the method as defined in claim 15 or 16.

34. A photovoltaic device comprising an n-type semiconductor layer, a first p-type semiconductor layer, a second p-type semiconductor layer at a higher p-type carrier concentration than that of the first p-type semiconductor layer and an electrode layer formed one on another in this order, wherein the first p-type semiconductor layer and the second p-type semiconductor layer each are a p-type semiconductor manufactured by the method as defined in claim 15 or 16.

35. A semiconductor device comprising a p-type semiconductor manufactured by the method as defined in claim 15 or 16, and an n-type semiconductor having a group Ib-IIIb-VI compound semiconductor as the matrix joined to the p-type semiconductor.

36. A method of manufacturing a semiconductor device as defined in claim 35, which comprises forming a semiconductor layer containing impurities by simultaneously supplying a group Ib element, a group IIIb element, a group VIb element and impurities into a film deposition apparatus, and continuously forming in the apparatus films of both of a p-type semiconductor and an n-type semiconductor, the films being joined and forming a pn comojunction having an identical group Ib-IIIb-VIb, compound semiconductor as a matrix.

* * * * *

UNITED STATES PATENT AND TRADEMARK OFFICE
CERTIFICATE OF CORRECTION

PATENT NO. : 6,153,895
DATED : November 28, 2000
INVENTOR(S) : Takayuki Watanabe et al.

Page 1 of 1

It is certified that error appears in the above-identified patent and that said Letters Patent is hereby corrected as shown below:

Column 18,
Line 1, after "Vb group element", insert a comma.
Line 14, after "or both", insert a comma.
Line 18, before "p-type", insert -- A --.
Line 37, "Ib-IIb-VIb$_2$" should read -- Ib-IIIb-VIb$_2$ --.

Column 19,
Line 2, after "I." delete "element.".

Column 20,
Line 11, "p-tvpe" should read -- p-type --.
Line 38, "comojunction" should read -- homojunction --.

Signed and Sealed this

Fourteenth Day of May, 2002

Attest:

JAMES E. ROGAN
Attesting Officer
Director of the United States Patent and Trademark Office